(12) United States Patent
Li et al.

(10) Patent No.: US 8,456,016 B2
(45) Date of Patent: Jun. 4, 2013

(54) METHOD AND CORE MATERIALS FOR SEMICONDUCTOR PACKAGING

(75) Inventors: Yonggang Li, Chandler, AZ (US); Amruthavalli P. Alur, Chandler, AZ (US); Devarajan Balaraman, Chandler, AZ (US); Xiwang Qi, Scottsdale, AZ (US); Charan K. Gurumurthy, Higley, AZ (US)

(73) Assignee: Intel Corporation, Santa Clara, CA (US)

( * ) Notice: Subject to any disclaimer, the term of this patent is extended or adjusted under 35 U.S.C. 154(b) by 518 days.

(21) Appl. No.: 12/729,821

(22) Filed: Mar. 23, 2010

(65) Prior Publication Data
US 2010/0289154 A1 Nov. 18, 2010

Related U.S. Application Data

(62) Division of application No. 12/242,414, filed on Sep. 30, 2008, now Pat. No. 7,749,900.

(51) Int. Cl.
*H01L 23/48* (2006.01)

(52) U.S. Cl.
USPC .................................. 257/774; 257/E23.011

(58) Field of Classification Search
USPC .................................. 257/774, 778, E23.011
See application file for complete search history.

(56) References Cited

U.S. PATENT DOCUMENTS

| | | | |
|---|---|---|---|
| 4,622,058 A | | 11/1986 | Leary-Renick et al. |
| 6,057,600 A | * | 5/2000 | Kitazawa et al. ............. 257/728 |
| 7,495,330 B2 | * | 2/2009 | Ichikawa ....................... 257/698 |

OTHER PUBLICATIONS

Non-Final Office Action for U.S. Appl. No. 12/242,414 Mailed Oct. 6, 2009, 6 Pages.
Restriction Requirement for U.S. Appl. No. 12/242,414 Mailed Jun. 10, 2009, 7 Pages.
Notice of Allowance and Fees for U.S. Appl. No. 12/242,414 Mailed Feb. 22, 2010, 4 Pages.

* cited by examiner

*Primary Examiner* — Roy Potter
(74) *Attorney, Agent, or Firm* — Blakely, Sokoloff, Taylor & Zafman LLP

(57) ABSTRACT

A semiconductor package comprises a semiconductor substrate that may comprise a core. The core may comprise one or more materials selected from a group comprising ceramics and glass dielectrics. The package further comprises a set of one or more inner conductive elements that is provided on the core, a set of one or more outer conductive elements that is provided on an outer side of the substrate, and a semiconductor die to couple to the substrate via one or more of the outer conductive elements. Example materials for the core may comprise one or more from alumina, zirconia, carbides, nitrides, fused silica, quartz, sapphire, and Pyrex. A laser may be used to drill one or more plated through holes to couple an inner conductive element to an outer conductive element. A dielectric layer may be formed in the substrate to insulate an outer conductive element from the core or an inner conductive element.

11 Claims, 4 Drawing Sheets

METHOD AND CORE MATERIALS FOR SEMICONDUCTOR PACKAGING

CROSS REFERENCE TO RELATED APPLICATIONS

This application is a Divisional of U.S. patent application Ser. No. 12/242,414, entitled "Method and Core Materials for Semiconductor Packaging", by Yonggang Li et al., filed on Sep. 30, 2008 now U.S. Pat. No. 7,749,900.

BACKGROUND

Some semiconductor packages may comprise semiconductor substrate. Some semiconductor substrates may comprise a core layer and two or more build-up layers. Example materials for the core layer may comprise glass fiber reinforced dielectrics such as epoxy resins. Some factors may influence substrate warpage, such as a stiffness of the core layer. The polymer-based material for the core layer may have a low mechanical stiffness that may limit thickness reduction of the core layer hence the whole substrate.

BRIEF DESCRIPTION OF THE DRAWINGS

The invention described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements.

DETAILED DESCRIPTION

Figure 1A:
FIGS. 1A to 1F are schematic figures of an embodiment of the invention.

In the following detailed description, references are made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numbers refer to the same or similar functionality throughout the several views.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

The following description may include terms, such as upper, lower, top, bottom, first, second, etc. that are used for descriptive purposes only and are not to be construed as limiting.

Referring to FIG. 1A, a core 10 may be prepared. Example materials for the core 10 may comprise ceramic or glass dielectrics. For example, a core 10 may comprise one or more selected from a group that comprises alumina, zirconia, carbides, nitrides, fused silica, quartz, sapphire, or any other ceramic or glass dielectric materials. In one embodiment, the ceramic materials for the core 10 may have a full density or an amount of porosity. In another embodiment, the materials for the core 10 may have a Young's modulus that may be higher than 20 GPa (e.g., at a room temperature). For example, the materials for the core 10 may have a Young's modulus that may be higher than 100 GPa (e.g., at a room temperature). In another embodiment, the materials for the core 10 may have a coefficient of thermal expansion (CTE) that may be in proximity to that of a semiconductor die to be coupled to the core 10. For example, the core 10 may comprise materials that may have a CTE lower than 12 ppm/° C. In one embodiment, the ceramic core 10 may integrate high-k ceramic thin film decoupling capacitors.

In yet another embodiment, the ceramic materials for the core 10 may comprise alumina that may be compounded with silica or other elements. In another embodiment, the ceramic materials may be compounded with, e.g., around 50% to 100% $Al_2O_3$. In another embodiment, a thickness of the core 10 may be determined by a Young's modulus and a stiffness of the core 10a. In one example, a stiffness of the core 10 may be proportional to $Ed^3$, wherein E represents the Young's modulus and d represents the thickness. In one embodiment, the core 10 may have a thickness that may be from around 50 um to around 400 um; however, in some embodiments, the core 10 may have a different thickness. In another embodiment, the materials for the core 10 may have a thermal conductivity that may be from around 2 W/m·k to around 50 W/m·k. In another embodiment, the materials may have a dielectric strength from about 9 KV/mm to around 50 KV/mm. However, in some embodiments, other materials that have a different thermal conductivity and/or different dielectric strength may be utilized.

In one embodiment, the materials may have a dissipation factor lower than 0.01 (e.g., at 1 GHz). For example, the materials may have a dissipation factor lower than around 0.0003. In yet another embodiment, the materials may have a dielectric constant from e.g., around 5 to around 20 (e.g., at 1 GHz). In another embodiment, the material may have a water absorption of around zero. However, in some embodiments, other ceramic or glass materials have a different combination of properties may be utilized.

In another embodiment, the core 10 may comprise inorganic materials that may have a Young's modulus higher than that of, e.g., polymer-based organic core materials. For example, the inorganic materials may have a Young's modulus that may be 2 to 14 multiples higher than that of the polymer-based organic core material; however, in some embodiments, the inorganic materials may have a different Young's modulus. In one embodiment, the core 10 may have a comparable or increased stiffness with a reduced core thickness.

As shown in FIG. 1A, a first conductive layer 12 may be provided on a main surface, e.g., upper or lower side, of the core 10. In some embodiments, the first conductive layer 12 may be provided on each of the upper and lower sides of the core 10. In one embodiment, the first conductive layer 12 may comprise copper; however, in some embodiments, the first conductive layer 12 may comprise any other conductive materials.

Figure 1B:
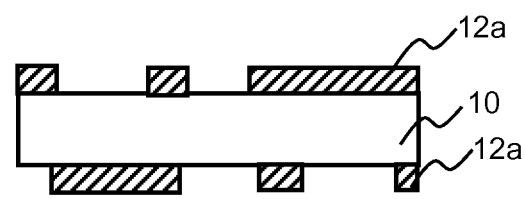
Figure 1C:
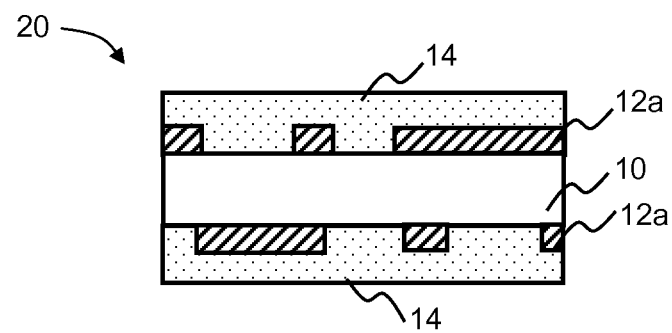

Referring to FIG. 1B, the first conductive layer 12 may be selectively patterned to provide a first set of one or more conductive elements 12a such as traces, planes or interconnects pins on the upper and/or the lower side of the core 10. Referring to FIG. 1C, a dielectric layer 14 may be provided on the first conductive layer 12 to provide a structure 20. Example materials for the dielectric layer 14 may comprise particulate-filled such as Ajinomoto build-up film (ABF), or glass fiber reinforced epoxy resin such as prepreg materials, or other insulating or dielectric materials. In one embodiment, surface roughening methods and/or adhesion promotion methods such as silane treatment may be utilized to bond the dielectric layer 14 to the core 10. For example, one or more green sheets for the core 10 may be roughened, e.g., prior to firing, to increase surface roughness of the core 10.

Figure 1D:
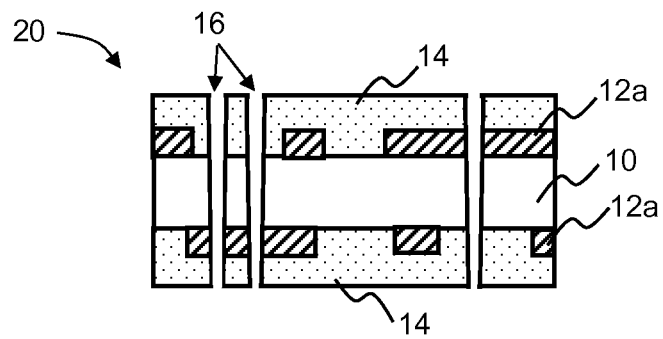

Referring to FIG. 1D, a set of one or more through holes 16 may be selectively formed in the structure 20. In one embodiment, a laser may be used to provide the through holes 16. The laser may have a pulse width in a magnitude of a nanosecond. In some embodiments, the laser may have a pulse width that may be shorter than a nanosecond. In one embodiment, the laser may have a spectrum in a range from infrared radiation (IR) to deep ultraviolet (DUV). Examples for the laser may comprise Q-switched or mode-locked Nd:YAG or Nd:YVO4 lasers that may have a harmonic of 1064 nm, 532 nm, 355 nm, 266 nm or any other harmonics; Q-switched or mode-locked Nd:YLF lasers that may have a harmonic of 1053 nm, 527 nm, 351 nm, 263 nm or any other harmonics; or fiber laser. In another embodiment, the laser may have a pulse repetition frequency in a level from kHz to MHz; however, in some embodiments, any other lasers or means may be used.

Referring again to FIG. 1D, a through hole 16 may have a diameter in a range from 10 um to 200 um at a laser entry side, e.g., an upper side of the structure 20. In some embodiments, a through hole 16 may have a diameter in a range from 10 um to 100 um at a laser exit side, e.g., a lower side of the structure 20. In some embodiments, a through hole 16 may have a different size. In another embodiment, one or more redundant through holes (not shown) may be drilled in the structure 20. In some embodiments, desmear, plugging, lapping, lid plating may not be required for the through holes 16. In some embodiments, an etching, e.g., chemical etching may be used to clean the through holes 16.

Figure 1E:
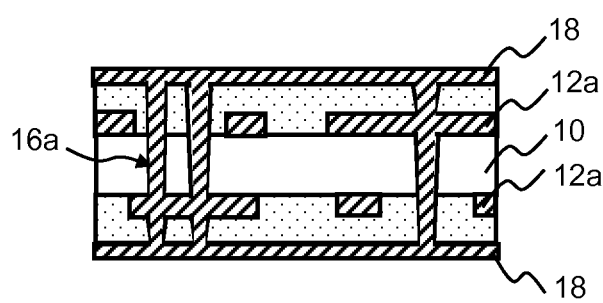

Referring to FIG. 1E, a through hole 16 may be plated or filled with copper to provide a plated through holes (PTH) 16a. As shown in FIG. 1E, a second conductive layer 18 may be provided on one side or both sides of the structure 20. For example, the second conductive layer 18 may comprise copper; however, in some embodiments, the second conductive layer 18 may comprise any other conductive material that is the same as the first conductive layer 12 and the PTH 16a. In one embodiment, a PTH 16a may be utilized to provide a high speed input/output (HSIO).

Figure 1F:
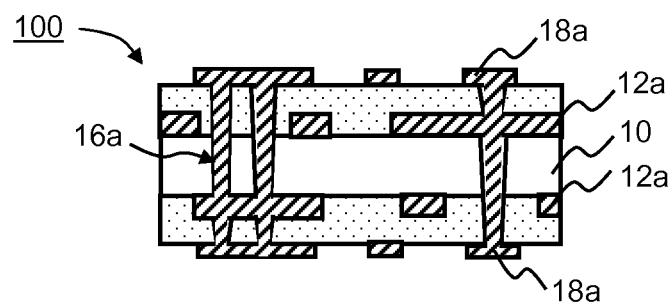

Referring to FIG. 1F, the second conductive layer 18 may be selectively patterned to provide a second set of one or more conductive elements 18a. For example, the second set of conductive elements 18a may provide one or more outer conductive elements for the substrate 100. As shown in FIG. 1F, an outer conductive element 18a on one side (e.g., upper side) of the substrate 100 may be coupled to another outer conductive element 18a on another side (e.g., lower side) of the substrate 100 and/or an inner conductive element 12a via a PTH 16a. In one embodiment, the substrate 100 may comprise an increased resistance to warpage.

Figure 2:
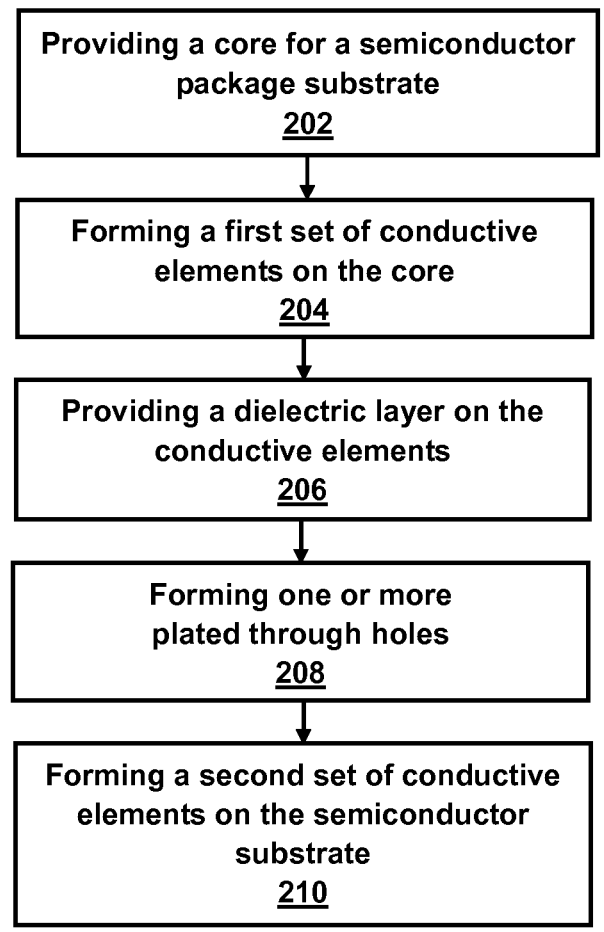
FIG. 2 is a schematic flow chart of a method according to an embodiment of the invention.

While the method of FIG. 2 may be illustrated to comprise a sequence of processes, the method in some embodiments may perform illustrated processes in a different order. While it is illustrated in FIGS. 1A through 1F that the conductive elements 12a of the substrate 100 may be coupled by the plated through holes (PTH), it may not be limited to PTHs and other variations may be utilized. For example, in one embodiment of FIG. 1F, the PTHs 16a may be used to at least selectively couple the conductive elements 12a that sandwich the core 10. In another embodiment, the PTHs 16a may selectively couple the conductive elements 12a on the core 10 to conductive elements 18a on the substrate 100.

Figure 4:
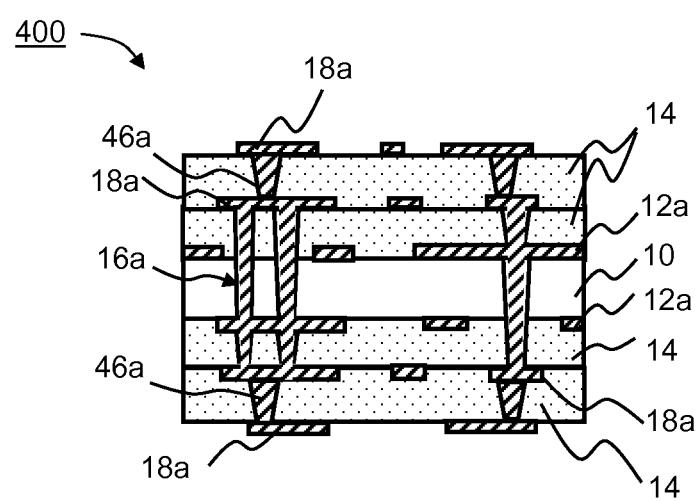
FIG. 4 is a schematic diagram of a system according to another embodiment of the invention.

Referring to FIG. 4, in another embodiment, more build-up layers, e.g., dielectric layers 14, may be formed on the substrate 400; however, in some embodiments, a different number of any other buildup layers may be utilized. As shown in FIG. 4, one or more vias 46a or similar structures may be formed in a buildup layer, e.g., a dielectric layer 14, to electrically couple a core layer 10 (e.g., conductive elements 12a) with at least one buildup layer (e.g., conductive elements 18a). In another embodiment, a via 46a may electrically couple adjacent buildup layers. In one embodiment, the vias 46a may be formed by laser or other means.

FIG. 2 illustrates an embodiment of a method. In one embodiment, the method may be described with reference to FIGS. 1A-1F. Referring to FIG. 2, in block 202, a core 10 for a semiconductor substrate 100 may be provided. Example materials for the core 10 may comprise ceramic or glass dielectrics. In block 204, a first conductive layer 12 may be provided on the core 10. The first conductive layer 12 may be selectively patterned to provide a first set of one or more conductive elements 12a on the core 10. In one embodiment, the first set of conductive elements 12a may provide one or more inner conductive elements in the substrate 100 (block 204). In block 206, a dielectric layer 14 may be provided on the conductive elements 12a and the core 10 that may be exposed in block 204. In one embodiment, example materials for the dielectric layer 14 may comprise glass fiber reinforced type of dielectrics. In another embodiment, the dielectric layer 14 may be bonded to the core 10, e.g., by an adhesive (not shown). In another embodiment, silane treatment or any other surface roughening methods or adhesion promotion methods may be used to enhance an adhesion between the dielectric layer 14 and the core 10. In yet another embodiment, surface roughening may be utilized on a green sheet for the core 10 to increase a surface roughness of the core 10.

Referring to FIG. 2 and FIG. 1D, in block 208, one or more through holes 16 may be formed in a structure 20 that comprises the core 10, the conductive elements 12 and the dielectric layer 14. In one embodiment, the through holes 16 may be drilled by a laser. The through holes 16 may be filled with conductive materials such as copper to provide plated through holes (PTH) 16a. In one embodiment, a PTH 16 may couple to one or more from a first set of conductive elements 12a in the substrate 100. In block 210, one or more second set of conductive elements 18a may be provided on one or each side of the substrate 100. For example, in block 210, a second conductive layer 18 may be provided on an outer side (e.g., up and/or lower) of the substrate 100 and may be selectively patterned to provide the second set of conductive elements 18a. In one embodiment, a conductive element 18a on one side of the substrate 100 may be coupled to another conductive element 18a on an opposite side of the substrate 100 and an inner conductive element 12 in the substrate 100.

While the method of FIG. 2 may be illustrated to comprise a sequence of processes, the method in some embodiments may perform illustrated processes in a different order.

Figure 3:
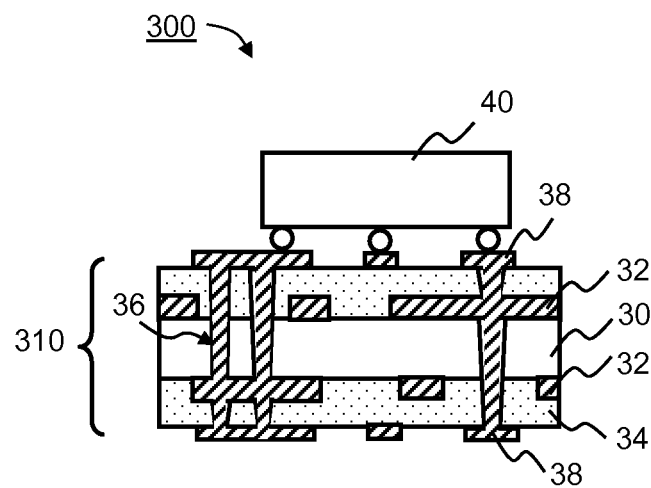
FIG. 3 is a schematic diagram of a system according to an embodiment of the invention.

FIG. 3 illustrates an embodiment of an embodiment of a system 300 that may be formed in a semiconductor package. In one embodiment, the system 300 may comprise a semiconductor substrate 310. In one embodiment, the substrate 310 may have a structure that may be similar to the embodiments as shown in FIG. 1F. For example, the substrate 310 may comprise a core 30. The substrate 310 may further comprise a set of one or more inner conductive elements 32 that may be provided on the core 310. The substrate 310 may comprise a set of one or more outer conductive elements 38 that may be provided on an outer side of the substrate 310. In one embodiment, the conductive elements 38 on top of the substrate 310 may be covered with a protective layer (not shown). A semiconductor die 40 may provided on the substrate 310 and couple to the substrate 310 via the outer conductive elements 38. Although FIG. 3 illustrates that the semiconductor die 40 may comprise a bump die, in some embodiments, the semiconductor die 40 may be coupled to the substrate 310 via any other interconnects; and in some embodiment, examples of the semiconductor die 40 may comprise any other integrated circuits to provide a system. For example, multiple-input multiple-output (MIMO) transceivers, system on chip (SOC) chips, radio frequency integrated circuits (RFIC), flash memory, DRAM or processors.

The substrate 310 may further comprise a dielectric layer 34 that may be provided between the outer conductive elements 38 and the core 30 or the inner conductive elements 32. In one embodiment, the dielectric layer 34 may selectively insulate an outer conductive element 38 from the core 30 or an inner conductive element 32. In another embodiment, the substrate 310 may comprise one or more PTHs 36 that may each couple an inner conductive element 32 to an outer conductive element 38. In another embodiment, a PTH 36 may couple an outer conductive element 38 on one side of the substrate 310 to another outer conductive element 38 on an opposite of the substrate 310. In one embodiment, example materials for the substrate 310 may refer to the embodiments of the substrate 100 as shown in FIG. 1F. In one embodiment, the system 300 may comprise a high density interconnection (HDI) package.

While certain features of the invention have been described with reference to embodiments, the description is not intended to be construed in a limiting sense. Various modifications of the embodiments, as well as other embodiments of the invention, which are apparent to persons skilled in the art to which the invention pertains are deemed to lie within the spirit and scope of the invention.

What is claimed is:

1. A semiconductor package, comprising:
   a semiconductor substrate that comprises a core, the core comprising one or more materials selected from a group comprising ceramics and glass dielectrics;
   a set of one or more inner conductive elements that is provided on the core;
   a set of one or more outer conductive elements that is provided on an outer side of the substrate;
   a semiconductor die to couple to the substrate via one or more of the outer conductive elements; and
   a dielectric layer that is to insulate the inner conductive elements from the outer conductive elements.

2. The package of claim 1, wherein the ceramics comprise one or more of alumina, zirconia, carbides, nitrides.

3. The package of claim 1, wherein the ceramics comprise 50% to 100% alumina that is compounded with other ceramic elements.

4. The package of claim 1, wherein the glass dielectrics comprise one or more from fused silica, quartz, and sapphire.

5. The package of claim 1, wherein the one or more materials have a Young's modulus that is higher than 100 GPa at a room temperature.

6. The package of claim 1, wherein the dielectric layer comprises glass fiber reinforced dielectric.

7. The package of claim 1, further comprising:
   a plated through hole to form interconnection to selectively couple at least the conductive elements on the core.

8. A system, comprising:
   a semiconductor package;
   a semiconductor substrate in the package that comprises a core, the core comprising a material selected from a group comprising ceramics and glass dielectrics;
   a semiconductor die to couple to the substrate via a first conductive element on the substrate;
   a dielectric layer that is provided on the core, the dielectric layer comprises glass fiber reinforced dielectric.

9. The system of claim 8, wherein the material has a Young's modulus that is higher than 100 GPa at a room temperature.

10. The system of claim 8, further comprising:
    a plated through hole that is formed in the substrate to couple the first conductive element to a second conductive element on the core.

11. The system of claim 8, wherein the core comprises one or more from alumina, zirconia, carbides, nitrides, fused silica, quartz, and sapphire.

* * * * *